United States Patent [19]

Forward

[11] 4,264,871
[45] Apr. 28, 1981

[54] LOW NOISE AMPLIFIERS

[75] Inventor: Robert L. Forward, Oxnard, Calif.

[73] Assignee: Hughes Aircraft Company, Culver City, Calif.

[21] Appl. No.: 30,186

[22] Filed: Apr. 16, 1979

[51] Int. Cl.³ .............................................. H03F 1/26
[52] U.S. Cl. .................................................. 330/149
[58] Field of Search ............... 330/61 A, 149; 333/32, 333/217

[56] References Cited

U.S. PATENT DOCUMENTS

| 3,079,569 | 2/1963 | De Loach | 333/217 X |
| 4,156,859 | 5/1979 | Forward et al. | 333/217 X |
| 4,180,786 | 12/1979 | Forward et al. | 330/149 X |

OTHER PUBLICATIONS

Graeme, "Don't Minimize Noise Figures", Electronic Design 2, Jan. 21, 1971, pp. 62-64.

Primary Examiner—James B. Mullins
Attorney, Agent, or Firm—D. O. Dennison; William H. MacAllister

[57] ABSTRACT

Circuits are described which optimize the signal-to-noise ratio of a signal amplifier by means of active circuits which simulate low-noise resistors. When such "absorbers" or "desorbers," as they are termed, are used in amplifier circuits with signal sources characterized by equivalent thermal noise resistances they provide low-noise means for matching the source and amplifier for optimum noise behavior. In accordance with the invention therefore, it is possible to utilize active circuit elements such as transistors or op-amps in such a way as to realize amplifiers which have better noise figures than conventional amplifiers fabricated of the same circuit elements.

1 Claim, 5 Drawing Figures

LOW NOISE AMPLIFIERS

DESCRIPTION

1. Technical Field

This invention relates to electronic signal amplifiers and more particularly to methods and apparatus for improving the signal-to-noise ratio of such amplifiers.

2. Background Art

A great deal of attention has been devoted to noise and the problems associated with noise in electronic circuits of all types. In fact, noise is considered as one of the factors in a signal receiver or amplifier which limits the minimum detectable signal and thereby the information handling capacity of the apparatus.

It is desirable, and in some cases critically so, that modern amplifiers be substantially noise-free. It is obvious however that perfection cannot be achieved, but can only be approximated, and then only by the exercise of sound engineering design. Simply stated, practical amplifiers degrade an input signal by adding some amount of internally generated noise. This noise is nearly random in nature and generally determines the ultimate lower limit of the amplifier's signal handling capacity. It is often expressed as an equivalent input noise and like the other input signals to an amplifier is increased by gain of the amplifier. However, unlike many other amplifier input parameters an analysis of the input noise is by no means straight-forward. It requires an interpretation of a number of involved and interrelated phenomena to understand the complete noise mechanism.

As an aid approximations of the noise behavior of amplifiers can be made by noise models in which ideal voltage and current generators represent the noise sources in the amplifier. These generators typically represent the rms noise voltage and rms noise current referred to the input of the amplifier. They are specified in terms of noise voltage density or noise current density per unit bandwidth. Another source of noise, which must be considered in optimizing the signal-to-noise ratio of an amplifier is the thermal noise associated with the resistive components of the source impedance seen by the amplifier.

In this regard, it is a general object of the present invention to optimize the signal-to-noise ratio of low-noise amplifiers.

In the noise model of an ideal electronic amplifier there are at least three sources of noise to be considered in the optimization process. These sources are the thermal noise of the resistive component of the source impedance, the equivalent voltage noise source of the amplifier and the equivalent current noise source of the amplifier. For low values of source resistance, the effect of the current noise source is small, in which case the voltage noise of the amplifier will dominate as the source of amplifier noise. As the source resistance is increased, the effect of the current noise increases until at very high source resistances it becomes the dominant component. Thus in characterizing amplifiers the two noise sources are often specified separately, with the voltage noise being specified at low source resistances and the current noise specified at high source resistances. Again, these noise parameters are often specified in terms of voltage squared or current squared versus frequency. Although the equivalent noise sources vary with frequency and other amplifier parameters, they are usually modeled by assuming some constant means value.

In choosing an amplifier, the requirements often dictate a certain source resistance from which the amplifier must work. This, in turn, dictates which noise component must be minimized. In general, high input impedance amplifiers such as field effect transistors or operational amplifiers will have lower current noise, thus tending to be quieter with higher source impedances. With low source impedances, the advantage resides in the bipolar transistors which have a lower voltage noise. In the case of operational amplifiers at least, it is also advantageous to minimize the feedback resistance vis-a-vis the source resistance.

In applications where it is possible to select the source impedance, the characteristic noise resistance of the amplifier may be used to advantage. The noise resistance $R_n$ can be defined for this purpose as the noise voltage divided by the noise current, mentioned above. It is known that the best noise performance for a given amplifier is obtained when the source resistance is equal to the noise resistance. In situations where it is not possible to select the source resistance, impedance matching techniques have been used. For example, optimum noise performance has been obtained, in the past, by using a transformer with a turns ratio selected to transform the actual source impedance to the noise resistance of the amplifier used.

It is another object of the present invention to provide low-noise means for matching the source resistance to the noise resistance of an amplifier.

DISCLOSURE OF INVENTION

In accordance with the principles of the present invention the above and other objects are accomplished by means of low-noise active circuits which simulate resistors. Simulated low-noise positive resistors are termed "absorbors" and negative simulated low-noise resistors are termed "desorbors". Both of the words "absorbor" and "desorbor" are coined words, with the ending "or" chosen to match the ending of the word "resistor". A wide variety of active circuits which are capable of realizing absorbors and desorbors are disclosed in the following copending U.S. Patent Applications:

Ser. No. 838,511, filed Oct. 3, 1977, now U.S. Pat. No. 4,156,859;

Ser. No. 881,296, filed Feb. 27, 1978, now U.S. Pat. No. 4,176,331; and

Ser. No. 018,688, filed Mar. 8, 1979, now pending.

In accordance with the first embodiment of the present invention an absorbor or desorbor is employed in parallel with the source impedance in order to bring the resistance of the parallel combination to a value which is equal to the noise resistance of the amplifier, thus meeting the optimization criteria. By the use of such low-noise active resistors, the signal-to-noise ratio of the resulting source-amplifier combination can be made equal to that of the impedance-transformed matching technique of the prior art.

In another embodiment of the present invention, a negative-resistance amplifier is obtained by combining an absorbor and desorbor. The signal-to-noise ratio of a negative resistance amplifier constructed according to these principles is also optimized.

BRIEF DESCRIPTION OF DRAWINGS

The above mentioned and other features and objects of the present invention will become more apparent by reference to the following descriptions taken in conjunction with the accompanying drawings wherein like reference numerals denote like elements and in which.

BEST MODE FOR CARRYING OUT THE INVENTION

As indicated hereinabove, all practical amplifier circuits are characterized complex internal noise sources and inherent bandwidth limitations. The noise sources can, to a first approximation, be represented by equivalent voltage and current noise sources as indicated in the schematic diagram of FIG. 1.

Figure 1:
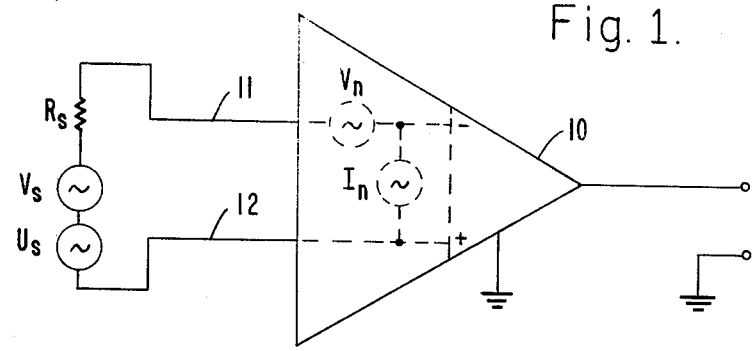
FIG. 1 is a simplified block diagram of an amplifier model showing its input referred noise sources.

In FIG. 1 there is shown a simplified circuit model of an operational amplifier which, as a first approximation, takes into account its input-referred noise components. The circuit model of FIG. 1 comprises an ideal section 10 with its conventional inverting and non-inverting input ports and an output port. One op-amp noise source is modeled as a voltage-noise generator $V_n$ in series between input terminal 11 and the inverting input of ideal op-amp section 10. The other noise source is modeled as a current-noise generator $I_n$ connected across the inverting and non-inverting inputs of the ideal op-amp section 10.

The input circuit shown in FIG. 1, has also been broken down into its idealized circuit elements. As shown, the input circuit comprises the serial combination of an ideal signal voltage source $U_s$, a source resistance $R_s$ and an ideal noise voltage source $V_s$. Generally it can be assumed that the noise source $V_s$ represents the thermal noise (i.e. $4kTBR_s$) of the source resistance $R_s$ even though other small noise contributions may be present.

In general, the noise of the circuit modeled in FIG. 1 at the input terminals of the ideal amplifier is given by:

$$N^2 = V_s^2 + V_n^2 + I_n^2 R_s^2. \qquad [1]$$

where the noise $N^2$ has been normalized by factoring out the amplifier gain. If the source resistance is low then the voltage noise component $V_n^2$ dominates; whereas if the source impedance is high the current noise component $I_n^2 R_s^2$ dominate. As mentioned, the source noise $V_s^2$ typically represents the thermal noise of the resistive component of the source impedance. If is apparent then that as $R_s$ becomes very small, then the noise becomes due, almost entirely, to the voltage noise component.

For $R_s \to 0$, $$N^2 \to V_n^2. \qquad [2]$$

It can be shown for the circuit of FIG. 1 the minimum obtainable noise occurs when the source impedance $R_s$ is made equal to $V_n/I_n$. For this value of $R_s$, Equation [1] becomes $$N^2 = V_s^2 + 2V_n^2, \qquad [3]$$

or $$N^2 = V_s^2 + 2V_n I_n R_s. \qquad [4]$$

The noise figure is:

$$NF_{opt} = \frac{N^2}{V_s^2} = 1 + \frac{2 V_n I_n R_s}{V_s^2}. \qquad [5]$$

However, since it is assumed that $V_s^2$ is equal to the thermal noise of $R_s$, ($V_s^2 = 4kTBR_s$)

$$NF_{opt} = 1 + \frac{2 V_n I_n}{4kTB}. \qquad [6]$$

From the preceeding discussion, it is apparent that one way of optimizing the noise figure of a circuit which is fed by a source having an impedance with a thermal noise resistance $R_s$ is to select $R_s$ so that it equals $V_n/I_n$.

Figure 2:
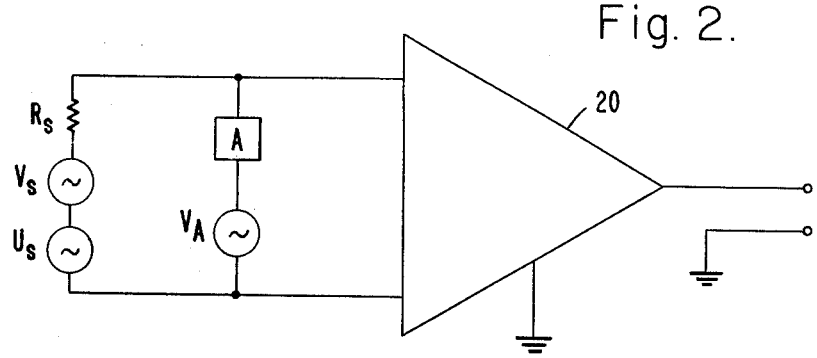
FIG. 2 is a schematic diagram of a first embodiment of the present invention.

In general, however the source impedance is determined by the characteristics of the signal source and cannot be easily manipulated. Matching $R_s$ to the noise resistance $V_n/I_n$, however can be achieved by means of the embodiment depicted in the simplified schematic diagram of FIG. 2. In FIG. 2, a low-noise temperature resistor or absorbor A is connected across the differential input terminals of an op-amp 20 in parallel with the source. The absorbor A also has associated with it an equivalent noise represented in FIG. 2 by source $V_A$. The magnitude of $V_A$ will be discussed in greater detail hereinbelow, but in general is much less than the thermal noise of a passive resistor of the same value and temperature. As in FIG. 1, the source is represented by the serial combination of a signal voltage source $U_s$, noise voltage source $V_s$ and ideal source resistor $R_s$. In general, the absorbor A can be positive or negative (desorbor) depending upon the match it is to provide. The impedance Z looking back to the source from the input terminals of the amplifier is:

$$Z = \frac{AR_s}{A + R_s}, \qquad [7]$$

which for an optimum noise figure also equates to $V_n/I_n$. Substituting, $$A = \frac{-V_n R_s}{V_n - R_s I_n}. \qquad [8]$$

It is seen then, that in order to obtain optimum noise performance with the circuit of FIG. 2 an absorbor (or desorbor in the case of a negative value) having a value determined by Equation [8] must be employed. Such an absorbor A can be constructed with another op-amp for example, in accordance with the teachings of the copending application Ser. No. 838,511, filed Oct. 3, 1977. A two-transformer version of such an absorbor is depicted in the schematic diagram of FIG. 3. The noise voltage of such an absorbor can be reduced to:

$$V_A{}^2 = 2V_n' I_n' A. \qquad [9]$$

where $V_n'$ and $I_n'$ are the equivalent voltage and current noise components associated with op-amp 30. For the sake of convenience, it can be assumed that $V_n'$ and $I_n'$ are substantially equal to $V_n$ and $I_n$.

With the absorbor A thus included in the circuit of FIG. 2 to match $R_s$ to the noise resistance characteristic of op-amp 20 the noise voltage becomes:

$$N^2 = V_n{}^2 + \frac{(R_s + A)^2}{A^2} V_n{}^2 \; V_n{}^2 R_s{}^2 + \frac{R_s{}^2}{A^2} V_A{}^2. \qquad [10]$$

By substituting Equations [8] and [9] and dividing through by $V_s{}^2$ the noise figure becomes:

$$NF^2 = 1 + \frac{2V_n I_n R_s}{V_s{}^2}, \qquad [11]$$

or, $$NF^2 = 1 + \frac{2V_n I_n}{4kTB}. \qquad [12]$$

which is exactly the optimum noise figure given by Equation [6].

What has been shown therefore, with the embodiment of FIG. 2, is that it is possible to obtain the optimum noise figure for an amplifier as modeled in FIG. 1 despite a non-optimum source impedance. This is done by using an absorbor or desorbor in parallel with the source to bring the combined source impedance to an optimum value. The use of an ordinary passive resistor for such purpose would be possible if the required match (Equation [8]) were positive. However the thermal noise contributed to the resulting circuit by a passive matching resistor would depend upon its value and temperature and could be substantial.

Figure 3:
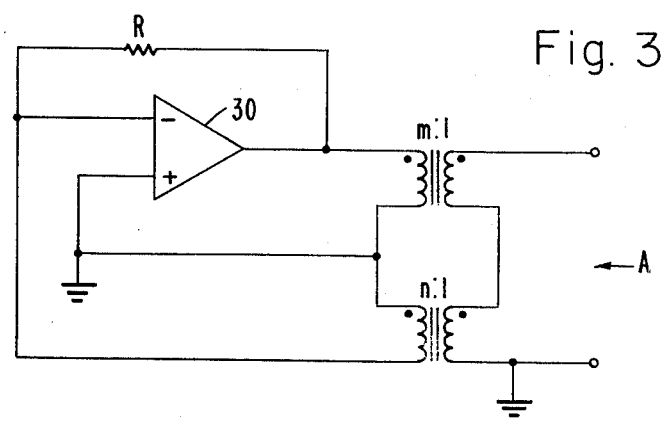
FIG. 3 is a schematic representation of an absorbor useful in practicing the present invention.
Figure 4:
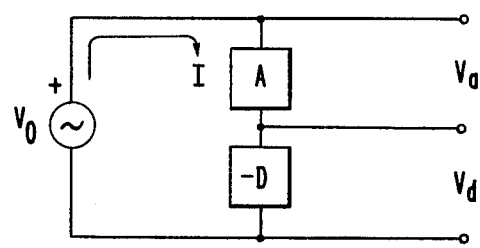
FIG. 4 is a schematic diagram of a negative resistance amplifier in accordance with another embodiment of the present invention.

Another embodiment of the present invention is depicted in the simplified schematic diagram of FIG. 4, in which an absorbor A and desorbor D are connected in series to form a negative resistance type amplifier. In FIG. 4 an ideal signal source $U_s$ is connected across the serial combination of A and D. The voltages across A and D are defined as $V_a$ and $V_d$ respectively. For the sake of analysis it is convenient to assume a two-transformer absorbor and a two-transformer desorbor of the types described in the above-mentioned copending application of Ser. No. 838,511. The absorbor, which corresponds to the one shown in FIG. 3 is characterized by a noise voltage $N_+$ given by:

$$N_+{}^2 = (\frac{1}{m} - \frac{1}{n})^2 V_n{}^2 + (n I_n A)^2 + 4kTB \frac{n}{m} A \qquad [13]$$

which, for low values of A, reduces to:

$$N_+{}^2 = (\frac{1}{m} - \frac{1}{n})^2 V_n{}^2 + 4kTB \frac{n}{m} A. \qquad [14]$$

The desorbor is similar to the circuit of FIG. 3 with the exception of a transformer interconnection reversal. The square of the noise voltage $N_-{}^2$ of such a desorbor is given by:

$$N_-{}^2 = (\frac{1}{m} - \frac{1}{n})^2 V_n{}^2 + (n I_n D)^2 + 4kTB \frac{n}{m} D \qquad [15]$$

which is similar to Equation [3] with the exception of the sign in the voltage term. Again, for low values of D.

$$N_-{}^2 = (\frac{1}{m} + \frac{1}{n})^2 V_n{}^2 + 4kTB \frac{n}{m} D. \qquad [16]$$

By selecting the magnitudes of the absorbor and desorbor so that A is slightly smaller than D amplification with relatively high gain can be obtained with the circuit of FIG. 4. That is, for $A \approx D$.

$$V_a = IA = \frac{A}{(A - D)} U_s \qquad [17]$$

and $$V_d = I(-D) = -\frac{A}{(A - D)} U_s \qquad [18]$$

so $V_a/U_s$ represents a high positive gain and $V_d/U_s$ represents a high negative gain for $A > D$.

Returning to the noise model of the operational amplifier depicted in FIG. 1, assume that the signal source is ideal. In this case the source resistor $R_s$ and the noise voltage generator $V_s$ would be zero. Under this assumed ideal condition the output signal-to-noise ratio is:

$$\left(\frac{S}{N}\right)_o = \frac{U_s}{V_N} \qquad [19]$$

or $$\frac{S}{N}{}_o^2 = \left(\frac{U_s}{V_N}\right)^2. \qquad [20]$$

Figure 5:
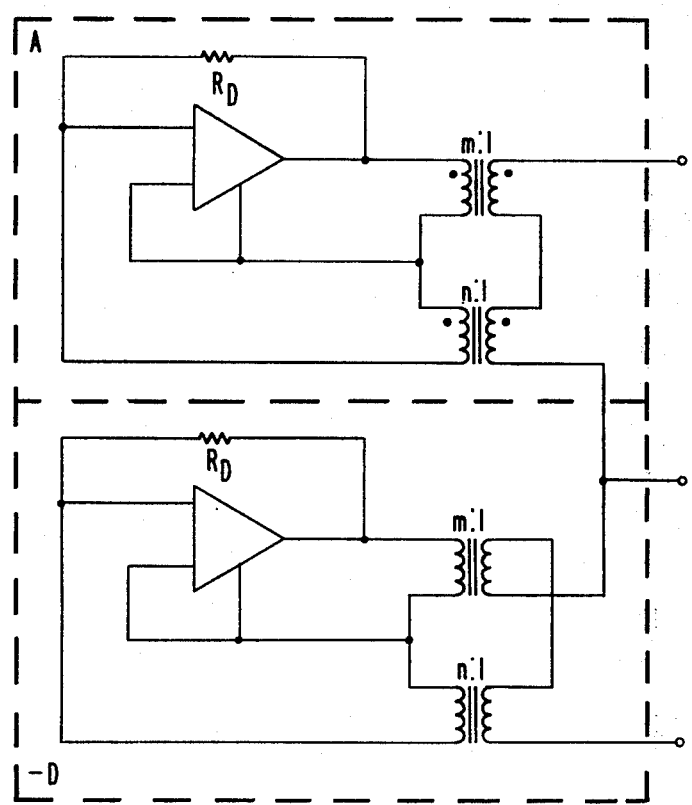
FIG. 5 is a more detailed schematic representation of a specific implementation of the embodiment of FIG. 4.

Assume now, that the amplifier is utilized to construct both the absorbor and desorbor of FIG. 4 as taught in the above-mentioned copending application Ser. No. 838,511. The resulting circuit is shown in FIG. 5 where the dotted line rectangles enclose the portions of the circuits corresponding to the absorbor A and desorbor D, respectively.

The noise of the resulting circuit is dominated by the amplifier voltage noise contribution as modified by the turns ratio of the two transformers. That is:

$$N_+{}^2 \approx (\frac{1}{m} - \frac{1}{n})^2 V_n{}^2 \qquad [21]$$

and $$N_-{}^2 \approx (\frac{1}{m} - \frac{1}{n})^2 V_n{}^2. \qquad [22]$$

The noise voltage across the absorbor A of FIG. 4 due to the equivalent noise source represented by $N_+{}^2$ is:

$$N_{+a} = N_+ - IA = \frac{D}{(A - D)} N_+, \qquad [23]$$

while the noise voltage across the desorbor D is:

$$N_{+d} = -N_{+a} = \frac{-D}{(A - D)} N_+. \qquad [24]$$

Similarly, the noise contribution across the desorbor due to the voltage source represented by $N_-^2$ is:

$$N_{-a} = -IA = \frac{-A}{(A-D)} N_-, \qquad [25]$$

whereas the contribution of $N_-$ to the desorbor voltage is:

$$N_{-d} = -N_{-a} = \frac{A}{(A-D)} N_-. \qquad [26]$$

Utilizing the principle of superposition and combining the noise contributions of each of the noise sources, the signal-to-noise power at either pair of output terminals can be obtained.

For example, across the absorbor A, the square of the signal-to-noise voltage ratio is:

$$\left(\frac{S}{N}\right)_a^2 = \frac{V_a^2}{N_{+a}^2 + N_{-a}^2}. \qquad [27]$$

Substituting from Equations [23] and [25] simplifying:

$$\left(\frac{S}{N}\right)_a^2 = \frac{U_s^2}{\left(\frac{D}{A}\right)^2 N_+^2 + N_-^2} \qquad [28]$$

And since for a high gain circuit $A \approx D$ and $$\left(\frac{S}{N}\right)_a^2 = \frac{U_s^2}{N_+^2 + N_-^2} = \qquad [29]$$

$$\frac{U_s^2}{\left(\frac{1}{m} - \frac{1}{n}\right)^2 V_n^2 + \left(\frac{1}{n} + \frac{1}{m}\right)^2 V_n^2},$$

Further assuming that m and n and $V_n$ are the same for both the absorbor A and desorbor D of FIG. 5 then Equation [29] reduces to:

$$\left(\frac{S}{N}\right)_a^2 = \frac{U_s^2}{2\frac{1}{m^2} + \frac{1}{n^2} V_n^2}. \qquad [30]$$

However, since $U_s^2/V_n^2$ is the original signal-to-noise ratio of the op-amp, $$\left(\frac{S}{N}\right)_a^2 = \frac{m^2 n^2}{2(m^2 + n^2)} \left(\frac{S}{N}\right)_o^2. \qquad [31]$$

Therefore so long as the turns ratio of the transformers of the absorbor and desorbor are such that when $(m^2 n^2)/(m^2+n^2) > 2$ or $m > n >> 2$ then the signal power-to-noise power of the circuit of FIG. 4 looking at an ideal signal source ($R_s = 0$) will be greater than the corresponding value of the signal power-to-noise power of the constituent amplifiers which comprise the circuit looking at the same ideal signal source.

If the signal source is not an ideal one, then an improvement in signal-to-noise power will be obtained for all values of the signal source resistance $R_s$, except for the single instance when $R_s = R_n$. At this value of $R_s$, the amplifiers will have them optimum noise figure given by Equation [6] when connected directly to the signal source, and the invention shown in FIG. 4 will not provide any further improvement.

In all cases, it is understood that the above-described embodiments are merely illustrative of but a few of the many possible specific embodiments which can represent applications of the principles of the present invention. Numerous and varied other arrangements can be readily devised in accordance with these principles by those skilled in the art without departing from the spirit and scope of the invention.

I claim:

1. A low noise circuit for providing amplified electrical signals comprising:

a source of electrical signals, said source being characterized by an inherent source resistance $R_S$;

an amplifier having an input port, an output port, and an internal noise represented by an equivalent input noise voltage $V_N$, an equivalent input noise current $I_N$, and an equivalent input noise resistance $R_N$; and coupling means for matching said source to said amplifier to obtain optimum noise performance, said coupling means having a simulated resistance $$A = -V_N R_S / (V_N - R_S I_N)$$

such that the source resistance $R_S$ is matched to the noise resistance $R_N$.

* * * * *